United States Patent
Zhang (10) Patent No.: US 8,689,076 B2
(45) Date of Patent: Apr. 1, 2014

(54) SYSTEMS AND METHODS FOR ENHANCED BIT CORRELATION USAGE

(75) Inventor: Fan Zhang, Milpitas, CA (US)

(73) Assignee: LSI Corporation, San Jose, CA (US)

(*) Notice: Subject to any disclaimer, the term of this patent is extended or adjusted under 35 U.S.C. 154(b) by 0 days.

(21) Appl. No.: 13/539,657

(22) Filed: Jul. 2, 2012

(65) Prior Publication Data

US 2014/0006894 A1 Jan. 2, 2014

(51) Int. Cl.
*H03M 13/00* (2006.01)

(52) U.S. Cl.
USPC .......................... 714/752; 714/762

(58) Field of Classification Search
USPC .......................... 714/752, 763, 778
See application file for complete search history.

(56) References Cited

U.S. PATENT DOCUMENTS

| | | | | |
|---|---|---|---|---|
| 7,237,180 B1* | 6/2007 | Shao et al. | ...................... | 714/778 |
| 8,122,314 B1* | 2/2012 | Yang et al. | ...................... | 714/752 |
| 8,176,401 B1* | 5/2012 | Yang et al. | ...................... | 714/792 |
| 2006/0156171 A1* | 7/2006 | Kuznetsov et al. | ........... | 714/755 |
| 2006/0265634 A1* | 11/2006 | Silvus et al. | ................... | 714/784 |
| 2009/0063933 A1* | 3/2009 | Richardson et al. | .......... | 714/763 |
| 2009/0177943 A1* | 7/2009 | Silvus et al. | ................... | 714/755 |
| 2010/0042891 A1* | 2/2010 | Gunnam et al. | .............. | 714/752 |
| 2011/0239080 A1* | 9/2011 | Sakaue et al. | ................. | 714/752 |
| 2011/0264980 A1* | 10/2011 | Li et al. | .......................... | 714/752 |
| 2012/0005551 A1* | 1/2012 | Gunnam | ....................... | 714/752 |
| 2012/0005552 A1* | 1/2012 | Gunnam | ....................... | 714/752 |

OTHER PUBLICATIONS

Jalden, J.; Ottersten, B.;, "Parallel Implementation of a Soft Output Sphere Decoder," Signals, Systems and Computers, 2005. Conference Record of the Thirty-Ninth Asilomar Conference on , vol., no., pp. 581-585, Oct. 28, 2005-Nov. 1, 2005.*

Louw, D.J.; Botha, P.R.; Maharaj, B.T.; , "A low complexity soft-input soft-output MIMO detector which combines a Sphere Decoder with a Hopfield network," MELECON 2010—2010 15th IEEE Mediterranean Electrotechnical Conference , vol., no., pp. 521-526, Apr. 26-28, 2010.*

Declercq, "Decoding Algorithms for Nonbinary LDPC Codes over GF(q)", IEEE Trans. on Commun., vol. 55(4), pp. 633-643 (Apr. 2007).

U.S. Appl. No. 13/167,764, Unpublished (filed Jun. 24, 2011) (Zongwang Li).

U.S. Appl. No. 13/316,758, Unpublished (filed Dec. 12, 2011) (Zongwang Li).

U.S. Appl. No. 13/445,834, Unpublished (filed Apr. 12, 2012) (Chung-Li Wang).

U.S. Appl. No. 13/251,340, Unpublished (filed Oct. 3, 2011) (Haitao Xia).

U.S. Appl. No. 13/284,826, Unpublished (filed Oct. 28, 2011) (Weijun Tan).

U.S. Appl. No. 13/274,443, Unpublished (filed Oct. 17, 2011) (Chung-Li Wang).

U.S. Appl. No. 13/227,538, Unpublished (filed Sep. 8, 2011) (Shaohua Yang) minim,.

U.S. Appl. No. 13/180,495, Unpublished (filed Jul. 11, 2011) (Chung-Li Wang).

(Continued)

*Primary Examiner* — Cynthia Britt (74) *Attorney, Agent, or Firm* — Hamilton DeSanctis & Cha (57) ABSTRACT

The present invention is related to systems and methods for applying a data decode algorithm to different rotations or modifications of a decoder input as part of data processing.

22 Claims, 5 Drawing Sheets

(56) References Cited

OTHER PUBLICATIONS

Wymeersch et al., "Log-Domain Decoding of LDPC Codes Over GF(q)", IEEE Int. Conf. on Commun., vol. 2, pp. 772-776 (Jun. 2004).

Zhao, "Joint Detection/Decoding Algorithms for Nonbinary LDPC Codes over ISI Channels" [online] [ret. On Nov. 9, 2012] Ret. From Internet: http://arxiv.org/abs/1209.2542v1.

* cited by examiner

| R/C | A | B | C | D | E | F | G | H | I | J | K | L | M | N | O | P | Q | R |
|---|---|---|---|---|---|---|---|---|---|---|---|---|---|---|---|---|---|---|
| 0 | 0 | 1 | 0 | 0 | 0 | 0 | 0 | 1 | 1 | 0 | 0 | 1 | 0 | 1 | 1 | 1 | 1 |   |
| 1 | 0 | 0 | 1 | 1 | 0 | 0 | 1 | 1 | 1 | 1 | 1 | 0 | 0 | 0 | 1 | 1 | 0 |   |
| 2 | 0 | 0 | 0 | 0 | 1 | 0 | 1 | 0 | 1 | 0 | 0 | 1 | 1 | 0 | 0 | 0 | 1 | 1 |
| 3 | 0 | 1 | 1 | 1 | 1 | 1 | 1 | 0 | 0 | 0 | 1 | 0 | 0 | 1 | 1 | 0 | 0 | 1 |
| 4 | 0 | 0 | 1 | 0 | 1 | 1 | 0 | 1 | 0 | 1 | 0 | 1 | 1 | 1 | 1 | 1 | 0 | 0 |
| 5 | 1 | 1 | 1 | 0 | 1 | 1 | 1 | 1 | 1 | 1 | 1 | 1 | 0 | 0 | 0 | 0 | 0 | 1 |
| 6 | 0 | 1 | 0 | 0 | 0 | 1 | 1 | 0 | 1 | 1 | 1 | 1 | 1 | 1 | 0 | 1 | 0 | 1 |
| 7 | 0 | 1 | 0 | 0 | 0 | 0 | 0 | 1 | 1 | 1 | 0 | 0 | 1 | 0 | 1 | 1 | 1 |   |
| 8 | 0 | 1 | 0 | 1 | 1 | 1 | 1 | 1 | 1 | 1 | 1 | 1 | 1 | 0 | 1 | 1 | 0 |   |
| 9 | 1 | 0 | 0 | 0 | 1 | 1 | 0 | 1 | 0 | 0 | 1 | 1 | 0 | 1 | 0 | 0 | 0 | 0 |

| | Sym A | Sym B | Sym C | Sym D | Sym E | Sym F | Sym G | Sym H | Sym I |
|---|---|---|---|---|---|---|---|---|---|
| Sym 1 | 0 / 0 | 1 / 0 | 0 / 1 | 0 / 1 | 0 / 0 | 0 / 0 | 0 / 1 | 1 / 1 | 1 / 1 |
| Sym 1 | 0 / 0 | 0 / 1 | 1 / 1 | 1 / 1 | 0 / 1 | 0 / 1 | 1 / 0 | 1 / 0 | 1 / 0 |
| Sym 2 | 0 / 0 | 0 / 1 | 0 / 1 | 0 / 1 | 1 / 1 | 0 / 1 | 1 / 1 | 0 / 0 | 1 / 0 |
| Sym 2 | 0 / 1 | 0 / 0 | 1 / 1 | 1 / 1 | 0 / 0 | 0 / 1 | 0 / 1 |   |   |
| Sym 3 | 0 / 1 | 0 / 1 | 1 / 1 | 0 / 0 | 1 / 1 | 1 / 1 | 0 / 1 | 1 / 1 | 0 / 1 |
| Sym 3 | 1 / 1 | 1 / 0 | 1 / 0 | 1 / 0 | 1 / 0 | 1 / 0 | 1 / 0 | 0 / 0 | 0 / 1 |
| Sym 4 | 0 / 0 | 1 / 1 | 0 / 0 | 0 / 0 | 1 / 0 | 1 / 0 | 0 / 0 | 1 / 1 | 1 / 1 |
| Sym 4 | 1 / 1 | 1 / 0 | 1 / 0 | 1 / 1 | 1 / 0 | 0 / 1 | 1 / 1 |   |   |
| Sym 5 | 0 / 1 | 1 / 0 | 0 / 0 | 1 / 0 | 1 / 1 | 1 / 1 | 1 / 0 | 1 / 1 | 1 / 0 |
| Sym 5 | 1 / 0 | 1 / 1 | 1 / 0 | 1 / 1 | 0 / 0 | 1 / 0 | 1 / 0 | 0 / 0 |   |

... | Sym1, SymF | Sym1, SymG | Sym1, SymH | Sym2, SymA | Sym2, SymB | ... | Sym2, SymF | Sym2, SymG | Sym2, SymH | Sym3, SymA | Sym3, SymB | ...

SYSTEMS AND METHODS FOR ENHANCED BIT CORRELATION USAGE

BACKGROUND OF THE INVENTION

The present invention is related to systems and methods for performing data processing, and more specifically to systems and methods for applying a data decode algorithm to different rotations of a decoder input as part of data processing.

Data processing circuits often include a data detector circuit and a data decoder circuit. In some cases many passes are made through both the data detector circuit and the data decoder circuit in an attempt to recover originally written data. Each pass through both data detector circuit and the data decoder circuit may include a number of iterations through the data decoder circuit. In some cases, a default processing through the data decoder and data detector circuits may not yield a correct result.

Hence, for at least the aforementioned reasons, there exists a need in the art for advanced systems and methods for data processing.

BRIEF SUMMARY OF THE INVENTION

The present invention is related to systems and methods for performing data processing, and more specifically to systems and methods for applying a data decode algorithm to different rotations of a decoder input as part of data processing.

Various embodiments of the present invention provide data processing systems that include: a data detector circuit, a signal set selector circuit, and a data decoder circuit. The data detector circuit is operable to apply a data detection algorithm to a data input to yield a first detected output, and to apply the data detection algorithm to the data input guided by a first decoded output to yield a second detected output. The signal set selector circuit is operable to select a first rotation of the first detected output, and to select a second rotation of the second detected output. The data decoder circuit is operable to: apply a data decoding algorithm to the first rotation of the first detected output to yield the first decoded output; and apply the data decoding algorithm to the second rotation of the second detected output to yield a second decoded output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for performing data processing, and more specifically to systems and methods for applying a data decode algorithm to different rotations of a decoder input as part of data processing.

Various embodiments of the present invention provide for using one grouping of an input data set for a first decoding period, and another grouping of the input data set during a second decoding period. In some particular embodiments of the present invention, the first grouping of the input data set and the second grouping of the input data set are used during alternating applications of a data decoding algorithm. Such an approach allows for utilization of correlation between different bits in the input data set to aid the data decoding algorithm. As an example, the grouping of the input data set used during the first decoding period may be described by the following equation:

$$\text{Symbol}_i = \{\text{Element}_{row+i,column}, \text{Element}_{row+i+1,column}, \text{Element}_{row+i,column+1}, \text{Element}_{row+i+1,column+1}\},$$

where the row and column indicate a location of the elements of a symbol relative to an array in which a codeword is arranged. The grouping of the input data set used during the second decoding period may be described by the following equation:

$$\text{Symbol}_i = \{\text{Element}_{row+i+1,column}, \text{Element}_{row+i+2,column}, \text{Element}_{row+i+1,column+1}, \text{Element}_{row+i+2,column+1}\}.$$

It should be noted that while the aforementioned equations imply four bit symbols, that other numbers of bits may be used for symbol sizes. As used herein, the terms "rotate", "rotating" or "rotation" are used in their broadest sense to mean any rearrangement of a data set. As one example such rotating or rotation includes re-grouping symbols. In one particular case, two different symbol groupings are used— one using a standard grouping across consecutive columns, and another where the first symbol includes some bits from one column and some bits from a non-consecutive symbol. Based upon the disclosure provided herein, one of ordinary skill in the art will recognize a variety of modifications that may be considered rotations within the scope of the present application.

In one particular embodiment of the present invention, data processing includes applying a data detection algorithm to a data set to yield a detected output. Subsequently, a data decoding algorithm is applied to the detected output to yield a decoded output. Processing through both the data detection algorithm and the data decoding algorithm is referred to as a "global iteration". In some cases, the data decoding algorithm is re-applied multiple times during a given global iteration. Each application of the data decoding algorithm is referred to as a "local iteration". An input data set may be processed through a number of global iterations which each includes one or more local iterations before the data set converges (i.e., results in all errors being corrected) or a failure to converge is indicated.

In one particular embodiment, the data decoding algorithm is applied to one grouping of the input data set during each odd numbered global iteration, and the data decoding algorithm is applied to another grouping of the input data set during each even numbered global iteration. In one particular case, the allowable number of global iterations is ten. Based upon the disclosure provided herein, one of ordinary skill in the art will recognize a variety of numbers of global iterations and local iterations that may be used in relation to different embodiments of the present invention.

Various embodiments of the present invention provide data processing systems that include: a data detector circuit, a signal set selector circuit, and a data decoder circuit. The data detector circuit is operable to apply a data detection algorithm to a data input to yield a first detected output, and to apply the data detection algorithm to the data input guided by a first decoded output to yield a second detected output. The signal set selector circuit is operable to select a first rotation of the first detected output, and to select a second rotation of the second detected output. The data decoder circuit is operable to: apply a data decoding algorithm to the first rotation of the first detected output to yield the first decoded output; and apply the data decoding algorithm to the second rotation of the second detected output to yield a second decoded output. In some cases, the data processing system is implemented as part of a storage device. In other cases, the data processing system is implemented as part of a receiving device. In various cases, the data processing system is implemented as part of an integrated circuit. In various instances of the aforementioned embodiments, the data decoding algorithm is a non-binary low density parity check data decoding algorithm. In some instances of the aforementioned embodiments, the data detection algorithm is a maximum a posteriori data detection algorithm or a Viterbi algorithm data detection algorithm.

Applying the data detection algorithm to the data input and applying the data decoding algorithm is a global iteration. In some instances of the aforementioned embodiments, the signal set selector circuit selects the first rotation of the first detected output based at least in part on an even number of global iterations, and the signal set selector circuit selects the second rotation of the second detected output based at least in part on an odd number of global iterations.

In some instances of the aforementioned embodiments, the data detector circuit is further operable to apply the data detection algorithm to the data input guided by the second decoded output to yield a third detected output; the signal selector circuit is further operable to select a first rotation of the third detected output; and the data decoder circuit is further operable to apply the data decoding algorithm to the first rotation of the third detected output to yield a third decoded output.

In various instances of the aforementioned embodiments, the first detected output and the second detected output each include a number of non-binary symbols. In some such instances, each of the non-binary symbols includes two bits. In other instances, each of the non-binary symbols includes four bits. In various instances, bits in the non-binary symbols are arranged in columns. In such instances, each of the non-binary symbols in the first rotation include bits from consecutive columns, at least one of the non-binary symbols in the second rotation include bits from non-consecutive columns. In various instances of the aforementioned embodiments, the data processing system further includes a rotation circuit operable to rotate the second detected output to yield the second rotation of the second detected output such that at least one of the non-binary symbols in the second rotation include bits from non-consecutive columns.

Other embodiments of the present invention provide methods that include: applying a data detection algorithm to a data input to yield a first detected output; selecting a first rotation of the first detected output as a first decoder input; applying a decoding algorithm to the first decoder input to yield a first decoded output; applying the data detection algorithm to the data input guided by the first decoded output to yield a second detected output; selecting a second rotation of the second detected output as a second decoder input; and applying the decoding algorithm to the second decoder input to yield a second decoded output. In some such embodiments, applying the data detection algorithm to the data input and applying the data decoding algorithm is a global iteration. Selecting the first rotation of the first detected output is based at least in part on an even number of global iterations, and selecting the second rotation of the second detected output is based at least in part on an odd number of global iterations. In various cases, the data decoding algorithm is a non-binary low density parity check data decoding algorithm. In various instances of the aforementioned embodiments, the first detected output and the second detected output each include a number of non-binary symbols. In some such instances, bits in the non-binary symbols are arranged in columns. Each of the non-binary symbols in the first rotation include bits from consecutive columns, and at least one of the non-binary symbols in the second rotation include bits from non-consecutive columns.

Figure 1:
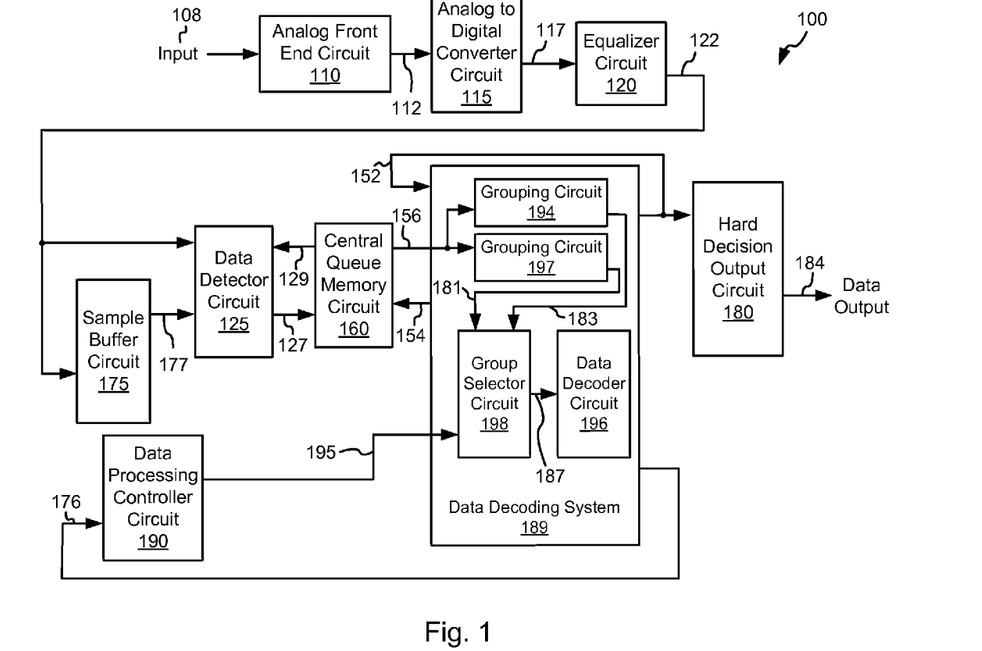
FIG. 1 depicts a data processing circuit having alternating decoder input rotating circuitry in accordance with some embodiments of the present invention.

Turning to FIG. 1, a data processing circuit 100 having alternating decoder input rotating circuitry is shown in accordance with some embodiments of the present invention. Data processing circuit 100 includes an analog front end circuit 110 that receives an analog input 108. Analog front end circuit 110 processes analog input 108 and provides a processed analog signal 112 to an analog to digital converter circuit 115. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog input 108 is derived from a read/write head assembly (not shown) that is disposed in relation to a storage medium (not shown). In other cases, analog input 108 is derived from a receiver circuit (not shown) that is operable to receive a signal from a transmission medium (not shown). The transmission medium may be wired or wireless. Based upon the disclosure provided herein, one of ordinary skill in the art will recognize a variety of sources from which analog input 108 may be derived.

Analog to digital converter circuit 115 converts processed analog signal 112 into a corresponding series of digital samples 117. Analog to digital converter circuit 115 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 117 are provided to an equalizer circuit 120. Equalizer circuit 120 applies an equalization algorithm to digital samples 117 to yield an equalized output 122. In some embodiments of the present invention, equalizer circuit 120 is a digital finite impulse response filter circuit as are known in the art.

Equalized output 122 is provided to both a data detector circuit 125 and to a sample buffer circuit 175. Sample buffer circuit 175 stores equalized output 122 as buffered data 177 for use in subsequent iterations through data detector circuit 125. Data detector circuit 125 may be any data detector circuit known in the art that is capable of producing a detected output 127. As some examples, data detector circuit 125 may be, but is not limited to, a Viterbi algorithm detector circuit or a maximum a posteriori detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Detected output 127 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 127 is provided to a central queue memory circuit 160 that operates to buffer data passed between data detector circuit 125 and a data decoding system 189. In some cases, central queue memory circuit 160 includes interleaving (i.e., data shuffling) and de-interleaving (i.e., data un-shuffling) circuitry known in the art. When a data decoding system 189 is available, data decoding system 189 accesses detected output 127 from central queue memory circuit 160 as a decoder input 156. Data decoding system 189 provides decoder input 156 to a grouping circuit 194 and a grouping circuit 197.

Grouping circuit 194 provides a first rotated decoder input 183 (i.e., a first grouping) which is a first rotation of decoder input 156. In one particular embodiment of the present invention, the first rotation is a non-rotation. In such a case, grouping circuit 194 is a pass through circuit that provides decoder input 156 as first rotated decoder input 183. An example of a decoder input without rotation is described in FIGS. 2a-2c where the symbols introduced to the data decoder circuit are described in accordance with the following equation:

$$\text{Symbol}_i = \{\text{Element}_{row+i,column}, \text{Element}_{row+i+1,column}, \text{Element}_{row+i,column+1}, \text{Element}_{row+i+1,column+1}\},$$

where the row and column indicate a location of the elements of a symbol relative to an array in which a codeword is arranged. Again, it should be noted that while the aforementioned equations imply four bit symbols, that other numbers of bits may be used for symbol sizes. Characteristic of such a non-rotated decoder input is that the first symbol in a row includes elements from consecutive columns.

Grouping circuit 197 provides a second rotated decoder input 181 (i.e., a second grouping) which is a second rotation of decoder input 156. In one particular embodiment of the present invention, the second rotation is an offset rotation. An example of a decoder input with such offset rotation is described in FIGS. 3a-3d where the symbols introduced to the data decoder circuit are described in accordance with the following equation:

$$\text{Symbol}_i = \{\text{Element}_{row+i+1,column}, \text{Element}_{row+i+2,column}, \text{Element}_{row+i+1,column+1}, \text{Element}_{row+i+2,column+1}\},$$

Again, it should be noted that while the aforementioned equations imply four bit symbols, that other numbers of bits may be used for symbol sizes. Characteristic of such a rotated decoder input is that the first symbol in a row includes elements from non-consecutive columns resulting from a rotation or offset. This offset is continued across subsequent symbols in a given row.

A group selector circuit 198 selects either first rotated decoder input 183 or second rotated decoder input 181 as a decoder input 187 based upon a grouping selector signal 195. A data processing controller circuit 190 receives a decoder status signal 176 from data decoding system 189 that indicates convergence/non-convergence and the completion of a global iteration. In one particular embodiment of the present invention, data processing controller circuit 190 asserts grouping selector signal 195 during even numbered global iterations for a given data set such that group selector circuit 198 selects first rotated decoder input 183, and data processing controller circuit 190 asserts grouping selector signal 195 during odd numbered global iterations for the given data set such that group selector circuit 198 selects second rotated decoder input 181. In other embodiments of the present invention, data processing controller circuit 190 asserts grouping selector signal 195 during lower numbered global iterations for a given data set such that group selector circuit 198 selects first rotated decoder input 183, and data processing controller circuit 190 asserts grouping selector signal 195 during higher numbered global iterations for the given data set such that group selector circuit 198 selects second rotated decoder input 181.

A data decoder circuit 196 is operable to apply a data decode algorithm to decoder input 187 to yield a decoded output 152. Similar to detected output 127, decoded output 152 may include both hard decisions and soft decisions. For example, data decoder circuit 196 may be any data decoder circuit known in the art that is capable of applying a decoding algorithm to a received input. Data decoder circuit 196 may be, but is not limited to, a low density parity check (LDPC) decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, decoded output 152 is stored to a memory included in a hard decision output circuit 180. In turn, hard decision output circuit 180 provides the converged decoded output 152 as a data output 184 to a recipient (not shown). The recipient may be, for example, an interface circuit operable to receive processed data sets. Based upon the disclosure provided herein, one of ordinary skill in the art will recognize a variety of recipients that may be used in relation to different embodiments of the present invention. Where the original data was not recovered (i.e., the data decoding algorithm failed to converge) prior to a timeout condition, another local iteration through data decoder circuit 196 may be applied to decoder input 187 guided by decoder output 152.

One or more iterations through the combination of data detector circuit 125 and data decoder circuit 196 may be made in an effort to converge on the originally written data set. As noted above, processing through both the data detector circuit and the data decoder circuit is referred to as a global iteration. In contrast, each pass through the data decoder circuit is referred to as a local iteration. For the first global iteration, data detector circuit 125 applies the data detection algorithm to equalized output 122 without guidance from a decoded output. For subsequent global iterations, data detector circuit 125 applies the data detection algorithm to buffered data 177 as guided by decoded output 152. Decoded output 152 is stored to central queue memory circuit 160 as a decoder output 154, and is provided from central queue memory circuit 160 as a detector input 129.

During each global iteration it is possible for data decoder circuit 196 to make one or more local iterations including application of the data decoding algorithm to decoder input 156. For the first local iteration, data decoder circuit 196 applies the data decoder algorithm without guidance from decoded output 152. For subsequent local iterations, data decoder circuit 196 applies the data decoding algorithm to decoder input 156 as guided by a previous decoded output 152. The number of local iterations allowed may be, for example, ten. Based upon the disclosure provided herein, one of ordinary skill in the art will recognize a variety of different numbers of local iterations that may be allowed in accordance with different embodiments of the present invention. Where the number of local iterations through data decoder circuit 196 exceeds that allowed, but it is determined that at least one additional global iteration during standard processing of the data set is allowed, decoded output 152 is provided back to central queue memory circuit 160 as decoded output 154. Decoded output 154 is maintained in central queue memory circuit 160 until data detector circuit 125 becomes available to perform additional processing. In contrast, where the number of local iterations through data decoder circuit 196 exceeds that allowed and it is determined that the allowable number of global iterations has been surpassed for the data set and/or a timeout or memory usage calls for termination of processing of the particular data set and an indication of a failure to converge.

Figure 2A:
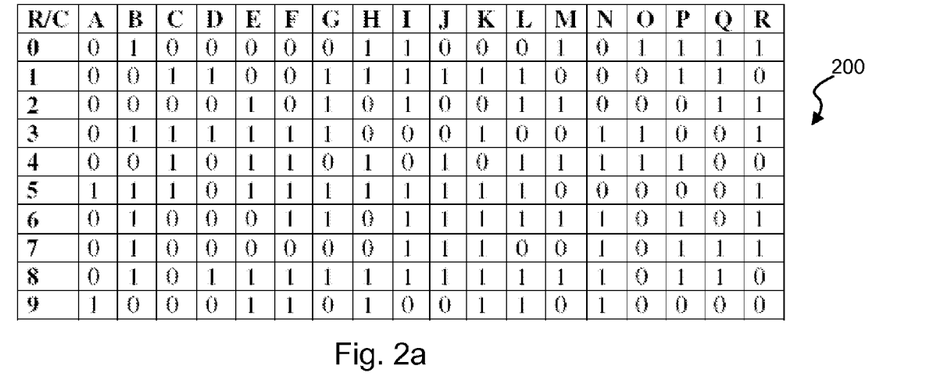
FIGS. 2a-2c and 3a-3d show examples of two different rotations of a decoder input that may be used in relation to various embodiments of the present invention.
Figure 2B:
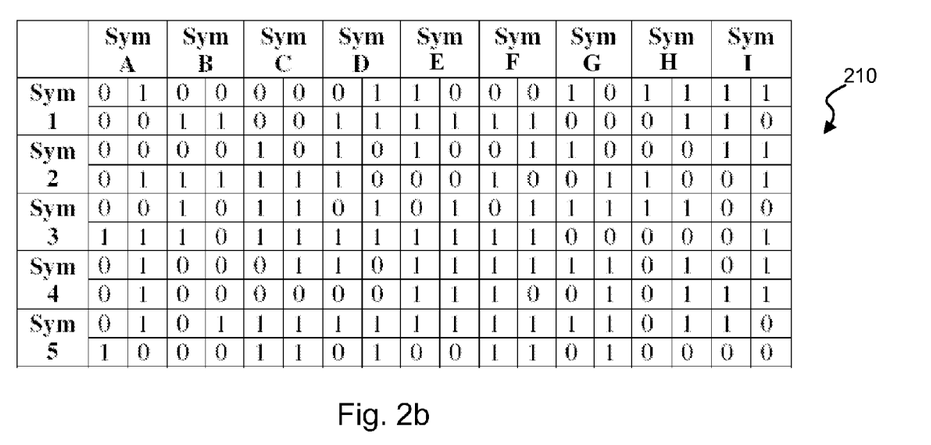
Figure 2C:
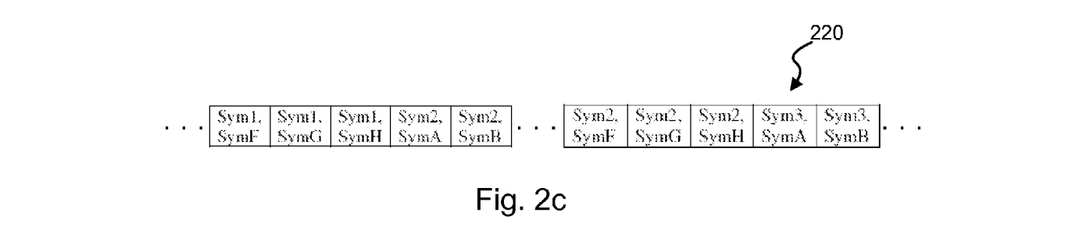

Turning to FIGS. 2a-2c, an example of a non-rotated decoder input that may be used in relation to various embodiments of the present invention is shown. FIG. 2a graphically depicts an array 200 corresponding to an example data set derived from a detected output. As shown, the array 200 is two dimension having ten (10) rows and eighteen (18) columns. As shown in an array 210 representing a non-rotated decoder input, the data set represented in array 200 is organized into four bit symbols designated by a column number (SymA-SymI) and a row number (Sym1-Sym5). Each of the four bit symbols are described in accordance with the following equation:

$$Symbol_i = \{Element_{row+i,column}, Element_{row+i+1,column}, Element_{row+i,column+1}, Element_{row+i+1,column+1}\},$$

where the row and column indicate a location of the elements of a symbol relative to an array in which a codeword is arranged. It should be noted that while the aforementioned equations and figures are directed to four bit symbols, that other numbers of bits may be used for symbol sizes. Characteristic of such a non-rotated decoder input is that the first symbol in a row includes elements from consecutive columns (e.g., columns A, B designated as SymB). This alignment continues across the row with the next symbol being drawn form the next consecutive columns (e.g., columns C,D designated as SymB; columns E,F designated as SymC; columns G,H designated as SymD; columns I,J designated as SymE; columns K,L designated as SymF; columns M,N designated as SymG; columns O,P designated as SymH; and columns Q,R designated as SymI). These symbols are provided in serial as a decoder input 220 to a data decoder circuit as shown in FIG. 2c.

Figure 3A:
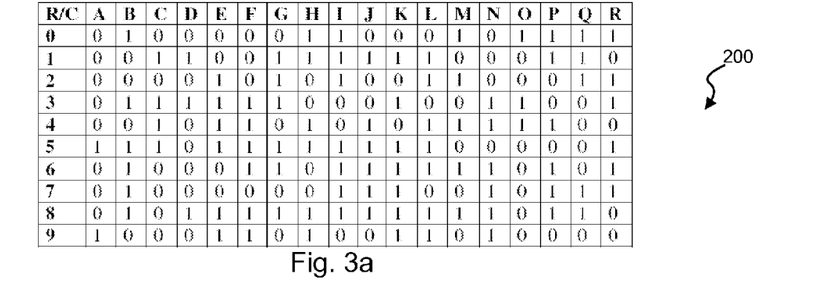
Figure 3B:
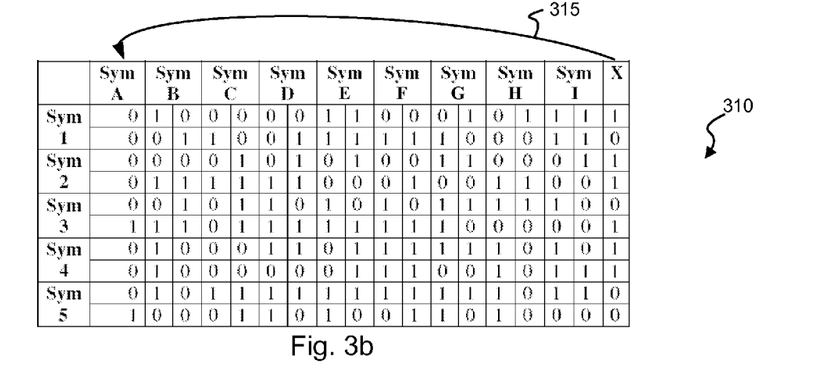

Turning to FIGS. 3a-3d, an example of a rotated decoder input that may be used in relation to various embodiments of the present invention is shown. FIG. 3a graphically depicts array 200 corresponding to an example data set derived from a detected output that is the same as that shown in FIG. 2a discussed above. Again, array 200 is two dimension having ten (10) rows and eighteen (18) columns. As shown in an array 310 representing a rotated decoder input, the data set represented in array 200 is organized into four bit symbols designated by a column number (SymA-SymI and X) and a row number (Sym1-Sym5). Each of the four bit symbols are described in accordance with the following equation:

$$Symbol_i = \{Element_{row+i+1,column}, Element_{row+i+2,column}, Element_{row+i+1,column+1}, Element_{row+i+2,column+1}\}.$$

Figure 3C:
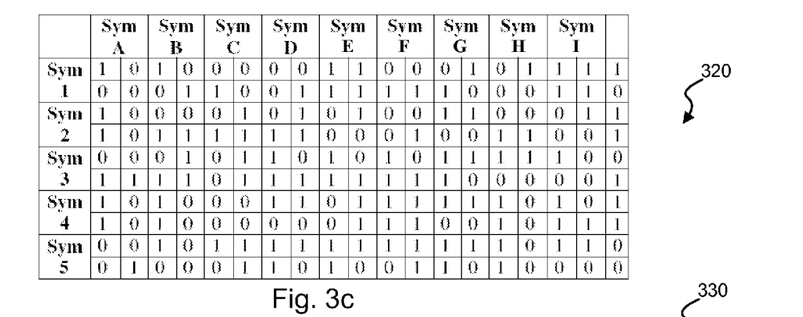
Figure 3D:
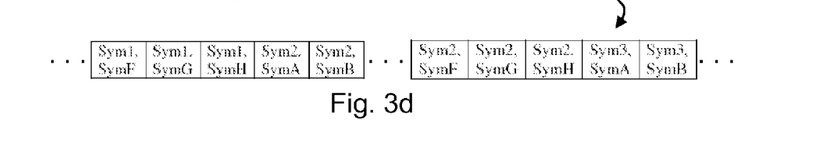

It should be noted that while the aforementioned equations imply four bit symbols, that other numbers of bits may be used for symbol sizes. Characteristic of such a rotated decoder input is that the first symbol in a row includes elements from non-consecutive columns (e.g., columns R, A designated as SymA). In particular, the last column identified as X is used as the first column as indicated by an arrow 315, and all of the other columns are shifted to the right by one. This alignment continues across the row with the next symbol being drawn form the next consecutive columns (e.g., columns B,C designated as SymB; columns D,E designated as SymC; columns F,G designated as SymD; columns H,I designated as SymE; columns J,K designated as SymF; columns L,M designated as SymG; columns N,O designated as SymH; and columns P,Q designated as SymI). FIG. 3c shows a data set 320 with the rotation of the last column to the first column to be included in SymA. The symbols as organized in data set 320 represent a rotated decoder input. The symbols in data set 320 are provided in serial as a decoder input 330 to a data decoder circuit as shown in FIG. 3d.

Figure 4A:
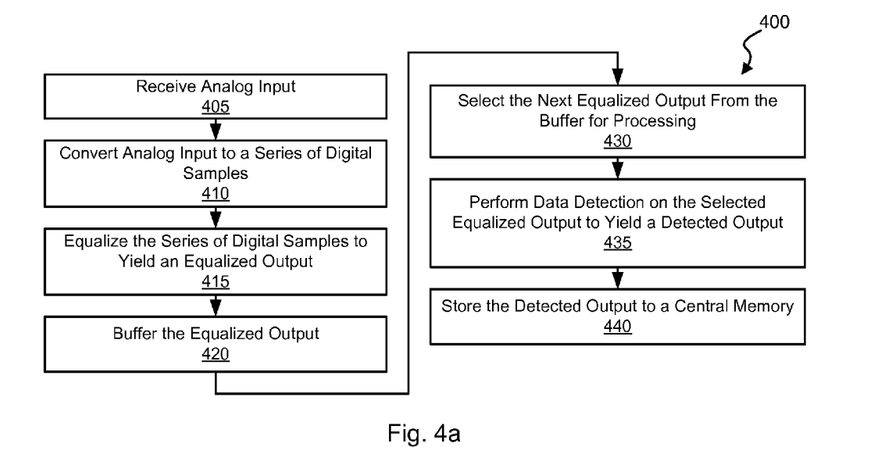
FIGS. 4a-4b are flow diagrams showing a method in accordance with some embodiments of the present invention for alternating rotated input decoding processing.
Figure 4B:
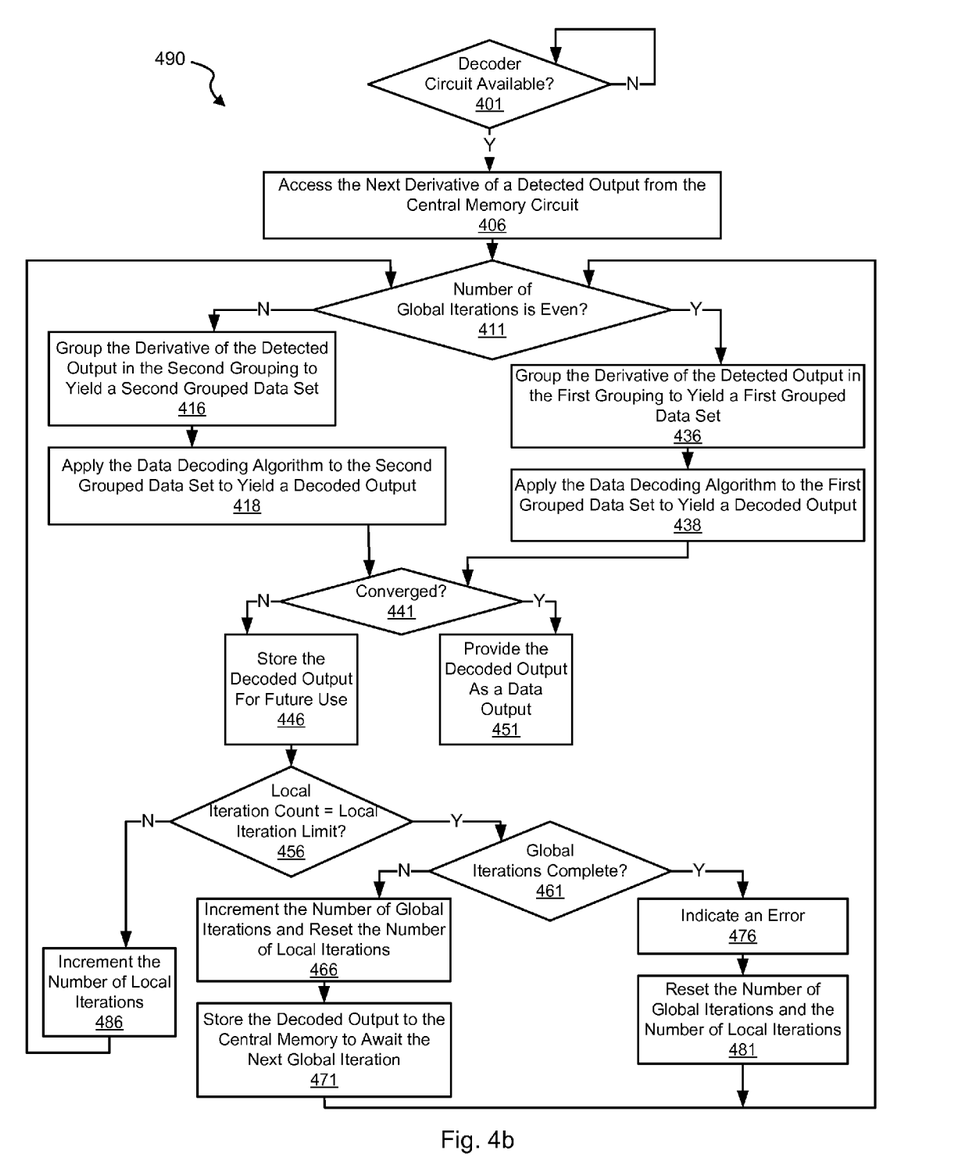

Turning to FIGS. 4a-4b, flow diagrams 400, 490 show a method in accordance with some embodiments of the present invention for alternating rotated input decoding processing. Turning to FIG. 4a and following flow diagram 400, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 420).

The next equalized output from the buffer is selected for processing (block 430). This selection may be done in accordance with any data processing circuit selection algorithm known in the art. A data detection algorithm is applied to the selected equalized output to yield a detected output (block 435), and the detected output (or a derivative thereof) is stored to a central memory circuit (block 440). In some cases, the stored data is interleaved or shuffled. This stored data may then be accessed from the central memory for data decoding (flow diagram 490). Flow diagram 490 is discussed in relation to FIG. 4b.

Turning to FIG. 4b, flow diagram 490 shows an implementation of the aforementioned data decode processing. Following flow diagram 490, it is determined whether a decoder circuit is available to process a previously stored detected output (block 401). Where the decoder circuit is available (block 401), the next derivative of a detected output is selected for processing and accessed from the central memory circuit (block 406). It is then determined whether the number of global iterations that have already been applied to the derivative of the detected output is even or odd (block 411). In other embodiments of the present invention, it may alternatively be determined whether the number of global iterations exceeds a threshold number. Where the number of global iterations applied to the given data set is even (block 411), the derivative of the detected output is grouped in a first grouping to yield a first grouped data set (block 436). The first grouping may be, for example, a non-rotated grouping similar to that described above in relation to FIGS. 2a-2c. A data decoding algorithm is then applied to the first grouped output to yield a decoded output (block 438). In particular embodiments of the present invention, the data decoding algorithm is a non-binary data decoding algorithm.

Alternatively, where the number of global iterations applied to the given data set is not even (i.e., is odd) (block 411), the derivative of the detected output is grouped in a first grouping to yield a second grouped data set (block 416). The second grouping may be, for example, a rotated grouping similar to that described above in relation to FIGS. 3a-3d. A data decoding algorithm is then applied to the second grouped output to yield a decoded output (block 418).

In either case, it is determined whether the decoded output converged (block 441). Where the decoded output converged (block 441), the decoded output is provided as a data output (block 451) and processing for the current data set completes. Alternatively, where the decoded output fails to converge (block 441), the decoded output is stored for future use (block 446).

It is determined whether the number of local iterations of the data decoding algorithm applied during the current global iteration is equal to a limit (block 456). In some embodiments of the present invention, the limit is ten local iterations. Where the number of local iterations does not equal the limit (block 456), the number of local iterations is incremented (block 486) and the processes of blocks 411 through 486 are repeated for the same data set guided by the result of the previous local iteration. Alternatively, where the number of local iterations equals the limit (block 456), it is determined whether the number of global iterations are complete (block 461). In some cases, the maximum number of global iterations is ten. Where the number of global iterations is complete (block 461), an error is indicated (block 476) and the number of local iterations and the number of global iterations is reset (block 481). Alternatively, where the number of global iterations is not complete (block 461), the number of global iterations is incremented (block 466) and the decoded output is stored to the central memory to await application of the subsequent global iteration (block 471).

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

Figure 5:
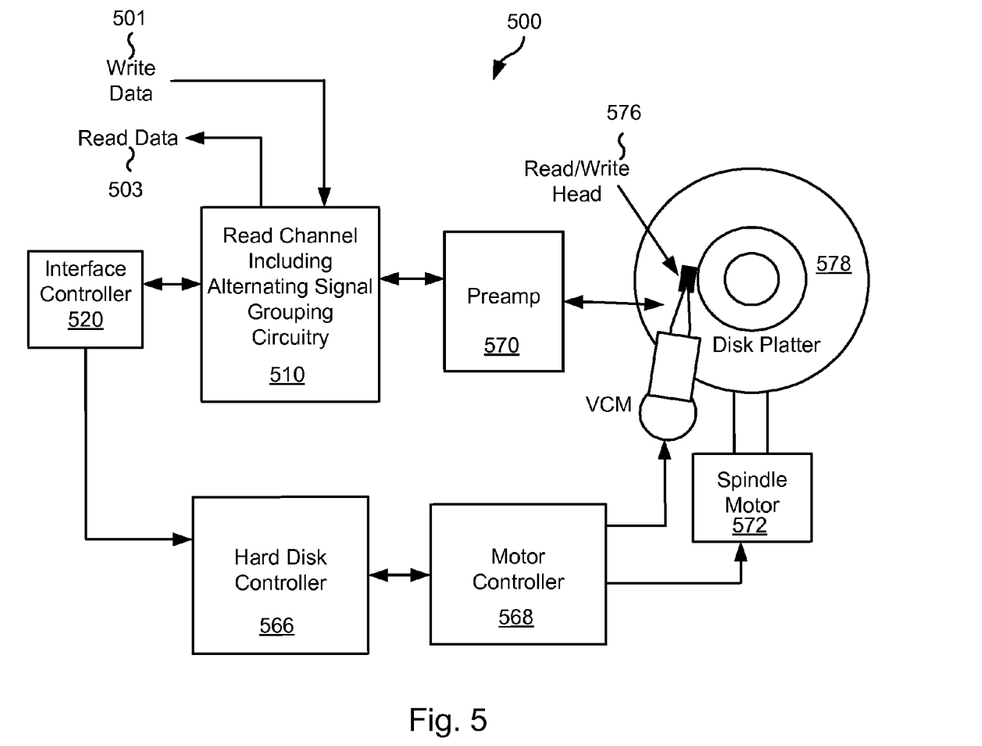
FIG. 5 shows a storage device including a read channel having alternating decoder input rotating circuitry in accordance with one or more embodiments of the present invention.

Turning to FIG. 5, a storage system 500 including a read channel circuit 510 having alternating decoder input rotating circuitry is shown in accordance with some embodiments of the present invention. Storage system 500 may be, for example, a hard disk drive. Storage system 500 also includes a preamplifier 570, an interface controller 520, a hard disk controller 566, a motor controller 568, a spindle motor 572, a disk platter 578, and a read/write head assembly 576. Interface controller 520 controls addressing and timing of data to/from disk platter 578. The data on disk platter 578 consists of groups of magnetic signals that may be detected by read/write head assembly 576 when the assembly is properly positioned over disk platter 578. In one embodiment, disk platter 578 includes magnetic signals recorded in accordance with either a longitudinal or a perpendicular recording scheme.

In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs). Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel circuit 510 via preamplifier 570. Preamplifier 570 is operable to amplify the minute analog signals accessed from disk platter 578. In turn, read channel circuit 510 decodes and digitizes the received analog signal to recreate the information originally written to disk platter 578. This data is provided as read data 503 to a receiving circuit. A write operation is substantially the opposite of the preceding read operation with write data 501 being provided to read channel circuit 510. This data is then encoded and written to disk platter 578.

During operation, data is sensed from disk platter 578 and processed. During processing a number of global iterations are applied to a given data set. In one embodiment of the present invention, the data input is grouped in a first way for application of the data decoding algorithm and on another global iteration the data input is grouped in a second way for application of the data decoding algorithm. In some embodiments of the present invention, data processing circuits similar to that discussed above in relation to FIG. 1 may be used, and/or the processing may be done similar to that discussed above in relation to FIGS. 4a-4b.

It should be noted that storage system 500 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 500 may be modified to include solid state memory that is used to store data in addition to the storage offered by disk platter 578. This solid state memory may be used in parallel to disk platter 578 to provide additional storage. In such a case, the solid state memory receives and provides information directly to read channel circuit 510. Alternatively, the solid state memory may be used as a cache where it offers faster access time than that offered by disk platted 578. In such a case, the solid state memory may be disposed between interface controller 520 and read channel circuit 510 where it operates as a pass through to disk platter 578 when requested data is not available in the solid state memory or when the solid state memory does not have sufficient storage to hold a newly written data set. Based upon the disclosure provided herein, one of ordinary skill in the art will recognize a variety of storage systems including both disk platter 578 and a solid state memory.

A data decoder circuit used in relation to read channel circuit 510 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 6:
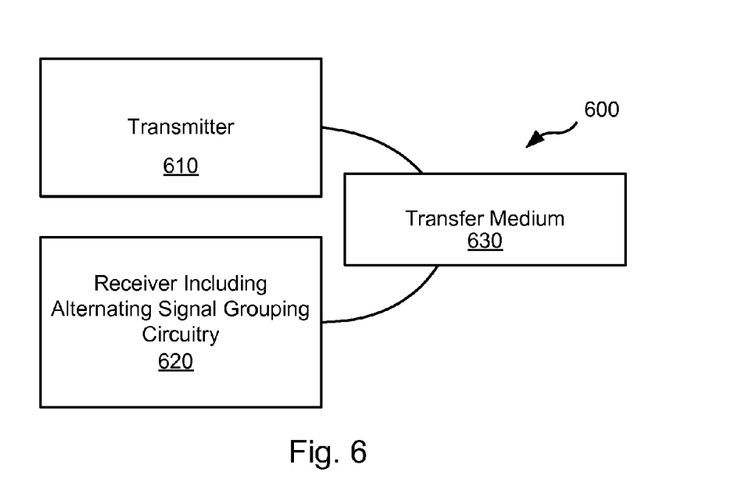
FIG. 6 shows a data transmission device including a receiver having alternating decoder input rotating circuitry in accordance with some embodiments of the present invention.

Turning to FIG. 6, a data transmission device 600 including a receiver 620 having decoder input rotating circuitry is shown in accordance with some embodiments of the present invention. Data transmission system 600 includes a transmitter 610 that is operable to transmit encoded information via a transfer medium 630 as is known in the art. The encoded data is received from transfer medium 630 by receiver 620.

During operation, data is received by receiver 620 via transfer medium 630 and processed using a standard processing. Such standard processing may be done using one rotation of a decoder input. In some cases, one or more data sets processed using standard processing fails to converge. In such a case, the non-converging data set is provided as an output with an indication that the non-converging data set is unusable, and the non-converging data set along with the corresponding non-detected/decoded data set are maintained in the data processing system for additional processing during a delay processing period. This delay processing period may be, for example, a period of time when no transmission is ongoing via transfer medium 630. During this delay processing period, the combination of the non-converging data set and the corresponding non-detected/decoded data set are accessed for reprocessing. The reprocessing includes performing data decoding on the decoder input in the original rotation to yield a first decoded output, and performing data decoding on the decoder input in another rotation to yield a second decoded output. The number of unsatisfied checks remaining in the first decoder output is compared with the number remaining in the second decoder output. Where the number of unsatisfied checks remaining in the second decoder output is greater than the number remaining in the first decoder output, the first decoder output is selected for future processing. Otherwise, the second decoder output is selected. In some embodiments of the present invention, data processing circuits similar to that discussed above in relation to FIG. 1 may be used, and/or the processing may be done similar to that discussed above in relation to FIGS. 4a-4b.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a data detector circuit operable to apply a data detection algorithm to a data input to yield hard decisions as a first detected output, and to apply the data detection algorithm to the data input guided by a first decoded output to yield hard decisions as a second detected output, wherein the first detected output and the second detected output include the same bit positions arranged in columns, and wherein the first detected output and the second detected output include a plurality of multi-bit symbols;
   a signal set selector circuit operable to select a first rotation of the first detected output, and to select a second rotation of the second detected output, wherein each of the multi-bit symbols in the first rotation includes bits from consecutive columns, and wherein at least one of the multi-bit symbols in the second rotation includes bits from non-consecutive columns;

a data decoder circuit operable to:
  apply a data decoding algorithm to the first rotation of the first detected output to yield the first decoded output; and
  apply the data decoding algorithm to the second rotation of the second detected output to yield a second decoded output.

2. The data processing system of claim 1, wherein applying the data detection algorithm to the data input and applying the data decoding algorithm is a global iteration, and wherein the signal set selector circuit selects the first rotation of the first detected output based at least in part on an even number of global iterations, and the signal set selector circuit selects the second rotation of the second detected output based at least in part on an odd number of global iterations.

3. The data processing system of claim 1, wherein the data decoding algorithm is a non-binary low density parity check data decoding algorithm.

4. The data processing system of claim 1, wherein:
  the data detector circuit is further operable to apply the data detection algorithm to the data input guided by the second decoded output to yield a third detected output;
  the signal selector circuit is further operable to select the first rotation of the third detected output; and
  the data decoder circuit is further operable to apply the data decoding algorithm to the first rotation of the third detected output to yield a third decoded output.

5. The data processing system of claim 1, wherein each of the multi-bit symbols includes a number of bits selected from a group consisting of: two bits, and four bits.

6. The data processing system of claim 1, wherein the data processing system further comprises:
  a rotation circuit operable to rotate the second detected output to yield the second rotation of the second detected output such that at least one of the non-binary symbols in the second rotation include bits from non-consecutive columns.

7. The data processing system of claim 1, wherein the data detector circuit is selected from a group consisting of: a Viterbi algorithm data detector circuit, and a maximum a posteriori data detector circuit.

8. The data processing system of claim 1, wherein the data decode algorithm is a low density parity check algorithm.

9. The data processing system of claim 1, wherein the data processing system is implemented as part of a device selected from a group consisting of: a storage device and a receiving device.

10. The data processing system of claim 1, wherein the data processing system is implemented as part of an integrated circuit.

11. The data processing system of claim 1, wherein the data processing system is implemented as part of a redundant array of inexpensive disks.

12. The data processing system of claim 1, wherein the data processing system further comprises:
  a storage medium;
  a head assembly disposed in relation to the storage medium and operable to provide a sensed signal corresponding to information on the storage medium;
  a read channel circuit including:
    an analog front end circuit operable to provide an analog signal corresponding to the sensed signal;
    an analog to digital converter circuit operable to sample the analog signal to yield a series of digital samples;
    an equalizer circuit operable to equalize the digital samples to yield the data input.

13. The data processing system of claim 12, wherein the data processing system further comprises:
  a solid state memory device.

14. A method, the method comprising:
  applying a data detection algorithm to a data input to yield hard decisions as a first detected output, wherein the first detected output includes bit positions arranged in columns, and wherein the first detected output includes a number of multi-bit symbols each including bit positions from at least two of the columns;
  selecting a first rotation of the first detected output as a first decoder input, wherein each of the multi-bit symbols in the first rotation includes bits from consecutive columns;
  applying a decoding algorithm to the first decoder input to yield a first decoded output;
  applying the data detection algorithm to the data input guided by the first decoded output to yield hard decisions as a second detected output, wherein the second detected output includes the bit positions arranged in the columns, and wherein the first detected output includes the number of multi-bit symbols each including bit positions from at least two of the columns;
  selecting a second rotation of the second detected output as a second decoder input, wherein at least one of the multi-bit symbols in the second rotation includes bits from non-consecutive columns; and
  applying the decoding algorithm to the second decoder input to yield a second decoded output.

15. The method of claim 14, wherein applying the data detection algorithm to the data input and applying the data decoding algorithm is a global iteration, and wherein selecting the first rotation of the first detected output is based at least in part on an even number of global iterations, and selecting the second rotation of the second detected output is based at least in part on an odd number of global iterations.

16. The method of claim 14, wherein the data decoding algorithm is a non-binary low density parity check data decoding algorithm.

17. A data processing system, the data processing system comprising:
  a data detector circuit operable to apply a data detection algorithm to a data input to yield hard decisions as a first detected output, and to apply the data detection algorithm to the data input guided by a first decoded output to yield hard decisions as a second detected output, wherein the first detected output and the second detected output include the same bit positions;
  a signal set selector circuit operable to select a first rotation of the first detected output, and to select a second rotation of the second detected output, wherein the first rotation includes the bit positions grouped to yield a first set of multi-bit symbols arranged in multi-bit symbol positions, wherein the second rotation includes the bit positions grouped to yield a second set of multi-bit symbols arranged in the same multi-bit symbol positions, and wherein a multi-bit symbol of the first set of multi-bit symbols corresponding to a particular one of the multi-bit symbol positions includes bits from different bit positions than a multi-bit symbol of the second set of multi-bit symbols corresponding to the particular one of the multi-bit symbol positions;
  a data decoder circuit operable to:
    apply a data decoding algorithm to the first rotation of the first detected output to yield the first decoded output; and apply the data decoding algorithm to the second rotation of the second detected output to yield a second decoded output.

18. The data processing system of claim 17, wherein the data processing system further comprises:
a storage medium;
a head assembly disposed in relation to the storage medium and operable to provide a sensed signal corresponding to information on the storage medium;
a read channel circuit including:
an analog front end circuit operable to provide an analog signal corresponding to the sensed signal;
an analog to digital converter circuit operable to sample the analog signal to yield a series of digital samples;
an equalizer circuit operable to equalize the digital samples to yield the data input.

19. The data processing system of claim 17, wherein:
the data detector circuit is further operable to apply the data detection algorithm to the data input guided by the second decoded output to yield a third detected output;
the signal selector circuit is further operable to select the first rotation of the third detected output; and
the data decoder circuit is further operable to apply the data decoding algorithm to the first rotation of the third detected output to yield a third decoded output.

20. The data processing system of claim 17, wherein the data processing system is implemented as part of an integrated circuit.

21. The data processing system of claim 17, wherein the data processing system is implemented as part of a redundant array of inexpensive disks.

22. The data processing system of claim 17, wherein the data processing system is implemented as part of a device selected from a group consisting of: a storage device and a communication device.

* * * * *